(12) United States Patent
Koyama (10) Patent No.: US 11,538,921 B2
(45) Date of Patent: Dec. 27, 2022

(54) METHOD FOR MANUFACTURING SEMICONDUCTOR DEVICE

(71) Applicant: Mitsubishi Electric Corporation, Tokyo (JP)

(72) Inventor: Hidetoshi Koyama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 9 days.

(21) Appl. No.: 16/481,341

(22) PCT Filed: May 15, 2017

(86) PCT No.: PCT/JP2017/018240
§ 371 (c)(1),
(2) Date: Jul. 26, 2019

(87) PCT Pub. No.: WO2018/211568
PCT Pub. Date: Nov. 22, 2018

(65) Prior Publication Data
US 2020/0243667 A1    Jul. 30, 2020

(51) Int. Cl.
*H01L 21/336* (2006.01)
*H01L 29/40* (2006.01)
(Continued)

(52) U.S. Cl.
CPC .. *H01L 29/66462* (2013.01); *H01L 21/02271* (2013.01); *H01L 21/28587* (2013.01);
(Continued)

(58) Field of Classification Search
CPC ........... H01L 29/2003; H01L 29/66462; H01L 29/7787; H01L 29/402
See application file for complete search history.

(56) References Cited

U.S. PATENT DOCUMENTS 6,060,402 A * 5/2000 Hanson ............. H01L 21/30612
257/E21.22
7,795,642 B2 * 9/2010 Suh ..................... H01L 29/2003
257/194
(Continued)

FOREIGN PATENT DOCUMENTS

JP    S63-078575 A    4/1988
JP    H04-230041 A    8/1992
(Continued)

OTHER PUBLICATIONS

International Search Report; Written Opinion; and Notification of Transmittal of The International Search Report and the Written Opinion of The International Searching Authority, or the Declaration issued in PCT/JP2017/018240; dated Aug. 1, 2017.
(Continued)

*Primary Examiner* — Eva Y Montalvo
*Assistant Examiner* — David J Goodwin
(74) *Attorney, Agent, or Firm* — Studebaker & Brackett PC (57) ABSTRACT

A source electrode (5), a drain electrode (6) and a T-shaped gate electrode (9) are formed on a GaN-based semiconductor layer (3,4) to form a transistor. An insulating film (10,11) covering the T-shaped gate electrode (9) is formed. A property of the transistor is evaluated to obtain an evaluation result. A film type, a film thickness or a dielectric constant of the insulating film (10,11) is adjusted in accordance with the evaluation result to make a property of the transistor close to a target property.

12 Claims, 7 Drawing Sheets

(51) Int. Cl.
*H01L 29/66* (2006.01)
*H01L 21/02* (2006.01)
*H01L 21/285* (2006.01)
*H01L 21/311* (2006.01)
*H01L 21/66* (2006.01)
*H01L 29/20* (2006.01)
*H01L 29/205* (2006.01)

(52) U.S. Cl.
CPC ........ *H01L 21/31111* (2013.01); *H01L 22/20* (2013.01); *H01L 29/2003* (2013.01); *H01L 29/205* (2013.01)

(56) References Cited

U.S. PATENT DOCUMENTS

| | | | | |
|---|---|---|---|---|
| 9,640,647 | B2* | 5/2017 | Okazaki | H01L 29/402 |
| 2004/0038525 | A1* | 2/2004 | Meng | C23C 16/45542 |
| | | | | 438/656 |
| 2004/0224529 | A1* | 11/2004 | Totsuka | H01L 21/0254 |
| | | | | 438/767 |
| 2009/0078966 | A1* | 3/2009 | Asai | H01L 29/7783 |
| | | | | 257/194 |
| 2009/0085063 | A1* | 4/2009 | Makiyama | H01L 29/7787 |
| | | | | 257/192 |
| 2009/0242937 | A1 | 10/2009 | Marui et al. | |
| 2010/0155779 | A1* | 6/2010 | Murase | H01L 29/7787 |
| | | | | 257/192 |
| 2013/0277680 | A1* | 10/2013 | Green | H01L 28/60 |
| | | | | 257/76 |
| 2014/0264360 | A1* | 9/2014 | Huang | H01L 29/66462 |
| | | | | 257/76 |
| 2014/0284661 | A1 | 9/2014 | Williams et al. | |
| 2015/0236108 | A1* | 8/2015 | Kim | H01L 29/66863 |
| | | | | 257/194 |
| 2017/0317202 | A1* | 11/2017 | Green | H01L 21/28575 |
| 2020/0027872 | A1* | 1/2020 | Boles | H01L 21/02505 |

FOREIGN PATENT DOCUMENTS

| | | |
|---|---|---|
| JP | H10-270519 A | 10/1998 |
| JP | 2009-252756 A | 10/2009 |
| JP | 2012-094726 A | 5/2012 |
| JP | 2016-522982 A | 8/2016 |

OTHER PUBLICATIONS

An Office Action mailed by the Korean Intellectual Property Office dated Sep. 22, 2020, which corresponds to Korean Patent Application No. 10-2019-7032994 and is related to U.S. Appl. No. 16/481,341 with English language translation.

An Office Action mailed by the Korean Intellectual Property Office dated Feb. 25, 2021, which corresponds to Korean Patent Application No. 10-2019-7032994 and is related to U.S. Appl. No. 16/481,341 with English language translation.

An Office Action issued by the German Patent and Trade Mark Office dated Aug. 26, 2022, which corresponds to German Patent Application No. 112017007540.8 and is related to U.S. Appl. No. 16/481,341; with English language translation.

* cited by examiner

METHOD FOR MANUFACTURING SEMICONDUCTOR DEVICE

FIELD

The present invention relates to a method for manufacturing a semiconductor device.

BACKGROUND

A gate electrode having a T-shaped cross section is formed in a GaN-based semiconductor transistor (for example, see Patent Literature 1). In a typical manufacturing process for the vicinity of the gate of the GaN-based semiconductor transistor, first, an insulating film is formed on the surface of a semiconductor layer. Next, the insulating film is removed from a region in which the gate is to be formed, by patterning with resist and dry etching processing. Next, a transfer process for forming a gate metal is performed to form the T-shaped gate electrode so as to give a shape in which the gate metal with a longer dimension than the dimension of the opening of the insulating film mounts on the insulating film. A field plate is formed between a gate head of the T-shaped gate electrode and the semiconductor layer.

However, the semiconductor layer is damaged when the opening is formed in the insulating film by dry etching. As compared with GaAs-based semiconductor transistors, GaN-based semiconductor transistors more tend to have a trap formed in the semiconductor. This trap causes a pulse IV property to deteriorate and properties of the transistor to deteriorate. In order to improve this, a field plate structure is typically employed for GaN-based semiconductor transistors.

Moreover, GaN-based semiconductor transistors are allowed to operate at higher voltage than GaAs-based semiconductor transistors. Therefore, an electric field around the gate is relieved by a field plate, and a withstand voltage is improved. Accordingly, such a field plate is important also in view of a high withstand voltage.

CITATION LIST

Patent Literature

[PTL 1] JP 2012-094726 A

SUMMARY

Technical Problem

To form a T-shaped gate electrode, transfer is performed with respect to the opening region of an insulating film. In the case of displacement in positioning for this transfer, a planned dimension of a field plate cannot be obtained. Furthermore, also in the case where the opening dimension of the insulating film deviates, such a planned dimension of the field plate cannot be obtained. As a result, a target property of the transistor cannot be obtained.

It can also be considered that possible epitaxy deviation in addition to the process deviation results in further deviation from the target property of the transistor. There has been a problem that simultaneous occurrence of these things causes properties of transistors to deviate among individual wafers, which leads to a low yield.

The present invention is devised in order to solve the aforementioned problems, and an object thereof is to obtain a method for manufacturing a semiconductor device capable of suppressing property deviation among individual wafers.

Solution to Problem

A method for manufacturing a semiconductor device according to the present invention includes: forming a source electrode, a drain electrode and a T-shaped gate electrode on a GaN-based semiconductor layer to form a transistor; forming an insulating film covering the T-shaped gate electrode; evaluating a property of the transistor to obtain an evaluation result; and adjusting a film type, a film thickness or a dielectric constant of the insulating film in accordance with the evaluation result to make a property of the transistor close to a target property.

Advantageous Effects of Invention

In the present invention, a property of the transistor to obtain an evaluation result is evaluated, and a film type, a film thickness or a dielectric constant of the insulating film is adjusted in accordance with the evaluation result to make a property of the transistor close to a target property. Therefore, property deviation among individual wafers is suppressed.

DESCRIPTION OF EMBODIMENTS

A method for manufacturing a semiconductor device according to the embodiments of the present invention will be described with reference to the drawings. The same components will be denoted by the same symbols, and the repeated description thereof may be omitted.

Embodiment 1

Figure 1:
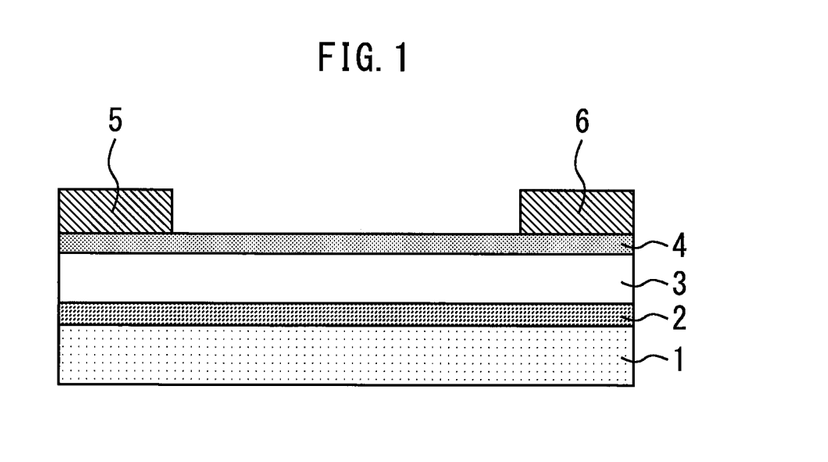
FIG. 1 is a cross-sectional view illustrating a method for manufacturing a semiconductor device according to Embodiment 1 of the present invention.

FIGS. 1 to 4 are cross-sectional views illustrating a method for manufacturing a semiconductor device according to Embodiment 1 of the present invention. First, as illustrated in FIG. 1, an AlN buffer layer 2, a GaN channel layer 3 and an AlGaN barrier layer 4 are sequentially grown on a SiC substrate 1. In place of the SiC substrate 1, a substrate composed of Si, sapphire, GaN or AlN may be used. A source electrode 5 and a drain electrode 6 are formed on the AlGaN barrier layer 4.

Figure 2:
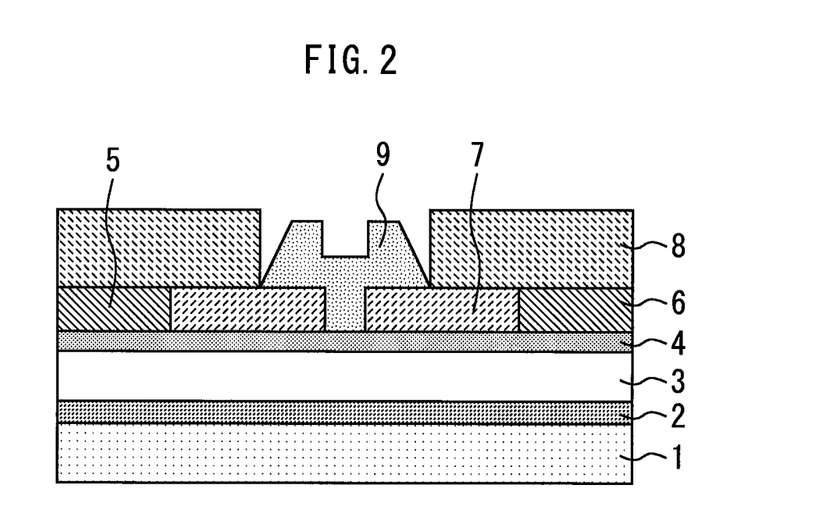
FIG. 2 is a cross-sectional view illustrating a method for manufacturing a semiconductor device according to Embodiment 1 of the present invention.

Next, as illustrated in FIG. 2, resists 7 and 8 are formed by a transfer process, and a T-shaped gate electrode 9 is formed between the source electrode 5 and the drain electrode 6 by vapor deposition, sputtering, plating or the like. A transistor is thereby formed. After that, the resists 7 and 8 are removed.

Figure 3:
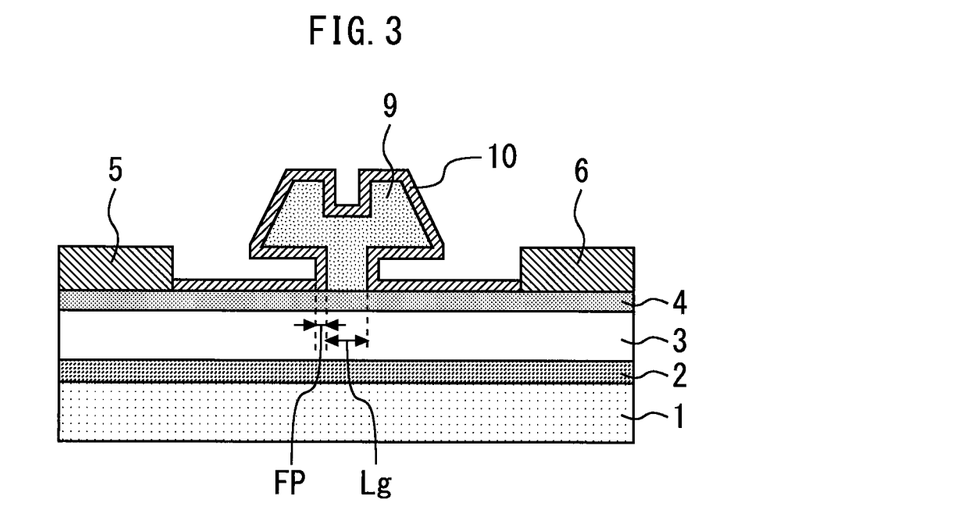
FIG. 3 is a cross-sectional view illustrating a method for manufacturing a semiconductor device according to Embodiment 1 of the present invention.

Next, as illustrated in, FIG. 3, an insulating film 10 covering the whole T-shaped gate electrode 9 is formed. In this stage, the insulating film 10 is not completely embedded between the T-shaped gate electrode 9 and the AlGaN barrier layer 4, but a gap is provided between the insulating film 10 on the lower surface of the gate head of the T-shaped gate electrode 9 and the insulating film 10 on the upper surface of the AlGaN barrier layer 4. The insulating film 10 on the lateral surface of the base portion of the T-shaped gate electrode 9 is sandwiched between the gate head of the T-shaped gate electrode 9 and the AlGaN barrier layer 4 to form a field plate.

Figure 4:
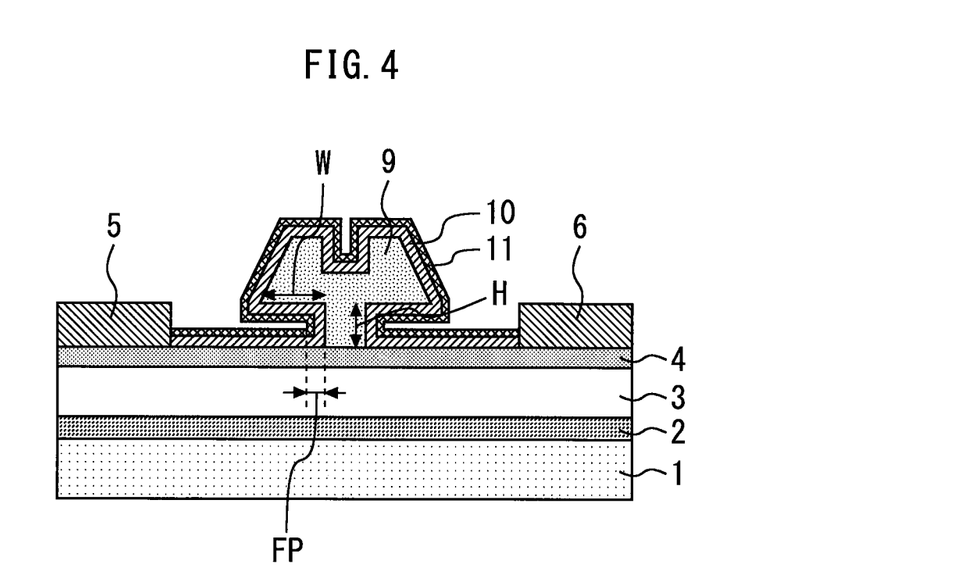
FIG. 4 is a cross-sectional view illustrating a method for manufacturing a semiconductor device according to Embodiment 1 of the present invention.

Next, a property of the transistor is evaluated. There can be a case where the evaluation result deviates from a target property owing to epitaxy deviation or deviation in gate length Lg. In such a case, as illustrated in FIG. 4, an insulating film 11 is formed on the insulating film 10 by a manufacturing method which has well controllability for its film thickness. Notably, when the evaluation result is the property as planned, the process is put forward to the next step without additionally forming the insulating film 11.

By adjusting the film thickness of the insulating film 11 in accordance with the evaluation result, the film thicknesses of the insulating films 10 and 11 on the lateral surface of the base portion of the T-shaped gate electrode 9 are adjusted. Thereby, a dimension FP of the field plate formed between the gate head of the T-shaped gate electrode 9 and the AlGaN barrier layer 4 is adjusted to make the property of the transistor close to the target property.

For example, when the gate length Lg is smaller than planned one, the dimension FP becomes long even when a width W of the gate head is as planned. When the dimension FP is long, a pulse IV property is improved but a capacity component is increased, which causes deterioration of the property of the transistor. Meanwhile, when the gate length Lg is larger than the planned one, the dimension FP becomes short even when the width W of the gate head is as planned. When the dimension FP is short, the pulse IV property is poor, which causes deterioration of the transistor property. Therefore, by additionally forming the insulating film 11 to adjust the dimension FP in accordance with the gate length Lg, the target transistor property can be obtained.

As described above, in the present embodiment, a property of the transistor is evaluated in the middle of the process, and by adjusting the film thicknesses of the insulating films 10 and 11 in accordance with the evaluation result, the property of the transistor is made close to a target property. In particular, as to process deviation, the deviation among individual wafers is larger than the deviation in the plane of a wafer. Therefore, property evaluation of transistors is performed for individual wafers, and the film thickness of the additional insulating film 11 is adjusted with respect to deviation from the target property for each wafer. Thereby, property deviation among individual wafers can be suppressed. As a result, the yield thereof can be improved. Moreover, an epitaxy property also deviates among individual wafers not so significantly as for the process deviation. Nevertheless, since the property evaluation of the transistor affords the result in which the influence of the epitaxy deviation is also considered, the deviation among individual wafers regarding the epitaxy deviation can also be suppressed at the same time.

Moreover, a semiconductor layer has been conventionally damaged when an opening in an insulating film is formed by dry etching in order to form a T-shaped gate electrode afterward. On the other hand, since in the present embodiment, the insulating films 10 and 11 are formed after the T-shaped gate electrode 9 is formed, deterioration of the property of the transistor can be avoided without damage.

Moreover, the dimension FP is adjusted with the film thicknesses of the insulating films 10 and 11 on the lateral surface of the base portion of the T-shaped gate electrode 9. Therefore, since conventional positioning displacement of the field plate due to transfer does not arise, the dimension FP can be set as planned. When an ALD method is used in particular, since the film thickness can be controlled at the atomic layer level, controllability of the dimension FP can be high.

It should be noted that transfer positioning of the resist 8 relative to the resist 7 be assumed to be displaced. Therefore, the width W of the gate head of the T-shaped gate electrode 9 is formed to be a longer dimension than the planned dimension FP. Since the dimension FP is determined by the film thicknesses of the insulating films 10 and 11, the dimension FP can be obtained as planned without the influence of the displacement of the transfer positioning. Moreover, a height H of the base portion of the T-shaped gate electrode 9 is set to be larger than twice the supposed dimension FP. Since the lower portion beneath the gate head of the T-shaped gate electrode 9 is thereby not filled with the insulating films 10 and 11, an excellent property can be obtained without an increase of unwanted parasitic capacitance.

Moreover, for evaluating a property of the transistor, a DC property is evaluated, such as a pinch-off property, a gate-source withstand voltage, a gate-drain withstand voltage, or a pulse IV property. Otherwise, by evaluating a small signal property of RF, a small signal gain MSG/MAG, fk, a transconductance gm, a gate-source capacity Cgs, a gate-drain capacity Cgd, a drain-source capacity Cds, a source inductance Ls or the like may be evaluated.

A field plate has an effect of relieving an electric field around the gate. Therefore, for example, when a drain leak current obtained by evaluating a pinch-off property as a DC property is higher than planned one, the drain leak current can be reduced by elongating the dimension FP to relieve the electric field. When a withstand voltage obtained by evaluating a gate-source withstand voltage or a gate-drain withstand voltage is lower than planned one, the withstand voltage can be improved likewise by elongating the dimension FP to relieve the electric field. When a pulse IV property obtained by the pulse IV property evaluation is lower than planned one, the pulse IV property can be improved likewise by elongating the dimension FP to relieve the electric field. When a capacity value obtained by evaluating a small signal property of RF is smaller than planned one, the capacity can be increased by elongating the dimension FP. When a value obtained by evaluating a small signal gain or fk is higher than planned one, the value can be reduced by elongating the dimension FP.

Each of the insulating films 10 and 11 takes a single layer or a stacked structure of layers composed by any of AlO, TaO, ZnO, SiO, MgO, GaO, TiO, HfO, ZrO, SiN and AlN.

When the insulating films 10 and 11 are formed by an ALD (Atomic Layer Deposition) method, a p-CVD (Chemical Vapor Deposition) method or a thermal CVD method, coatability of the insulating films 10 and 11 is good. Since the ALD method can control a film thickness at the atomic layer level, a target film thickness can be achieved with good controllability.

Figure 5:
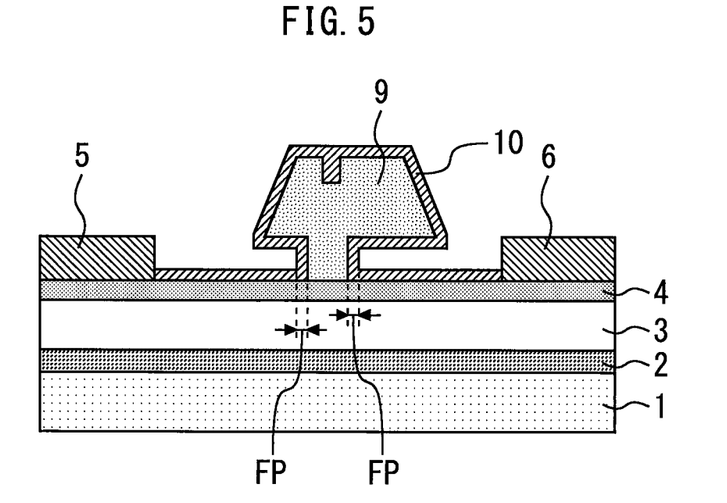
FIG. 5 is a cross-sectional view illustrating Modification 1 of the method for manufacturing a semiconductor device according to Embodiment 1 of the present invention.

FIG. 5 is a cross-sectional view illustrating Modification 1 of the method for manufacturing a semiconductor device according to Embodiment 1 of the present invention. Widths of the gate head of the T-shaped gate electrode 9 are asymmetric on the source electrode 5 side and the drain electrode 6 side. Elongating the width of the gate head can reduce a gate resistance Rg. But when the insulating films 10 and 11 are completely embedded between the gate head and the AlGaN barrier layer 4, the dimension FP is also elongated by the amount of elongating the width of the gate head, which increases a capacity component and diminishes the effect of improving a transistor property. On the other hand, when a gap is provided between the insulating films 10 and 11 on the lower surface of the gate head and the insulating films 10 and 11 on the AlGaN barrier layer 4, since the dimension FP is not elongated even if the width of the gate head is elongated, the gate resistance Rg can be reduced without an increase of the capacity component.

Figure 6:
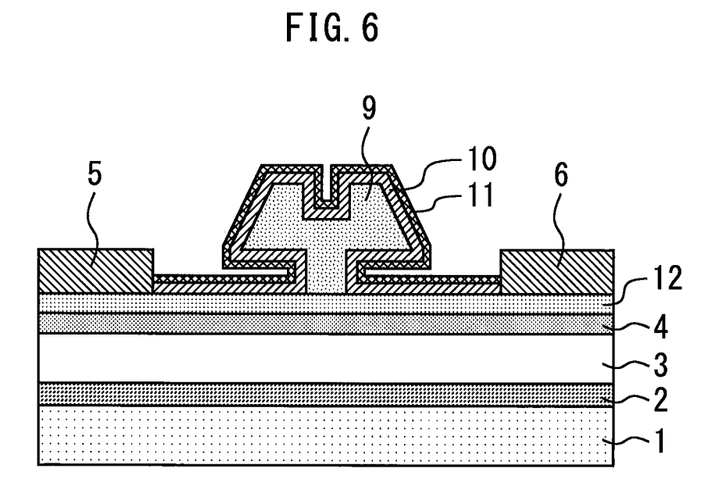
FIG. 6 is a cross-sectional view illustrating Modification 2 of the method for manufacturing a semiconductor device according to Embodiment 1 of the present invention.

FIG. 6 is a cross-sectional view illustrating Modification 2 of the method for manufacturing a semiconductor device according to Embodiment 1 of the present invention. A GaN cap layer 12 is added onto the AlGaN barrier layer 4. The GaN cap layer 12 may undergo n-type doping or p-type doping.

Figure 7:
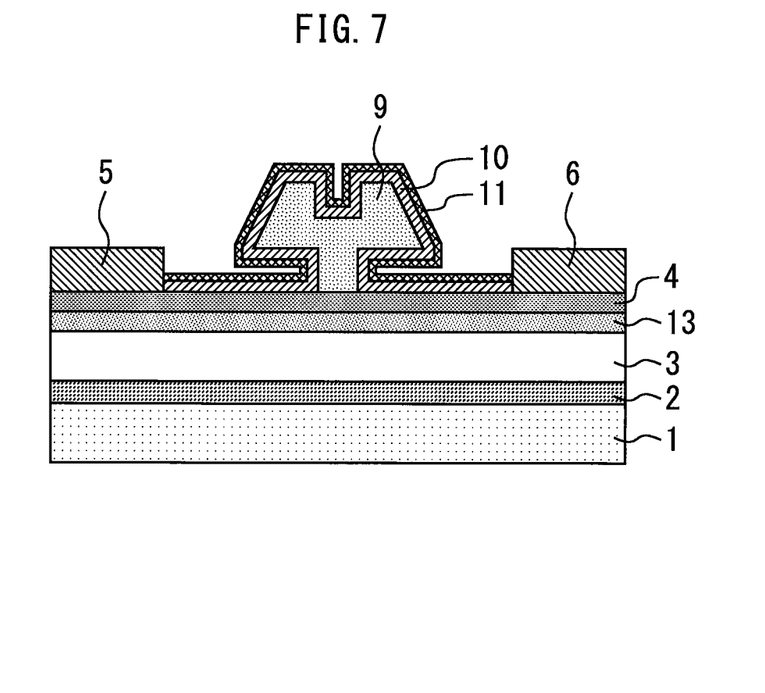
FIG. 7 is a cross-sectional view illustrating Modification 3 of the method for manufacturing a semiconductor device according to Embodiment 1 of the present invention.

FIG. 7 is a cross-sectional view illustrating Modification 3 of the method for manufacturing a semiconductor device according to Embodiment 1 of the present invention. An AlN spacer layer 13 is added between the AlGaN barrier layer 4 and the GaN channel layer 3.

Embodiment 2

Figure 8:
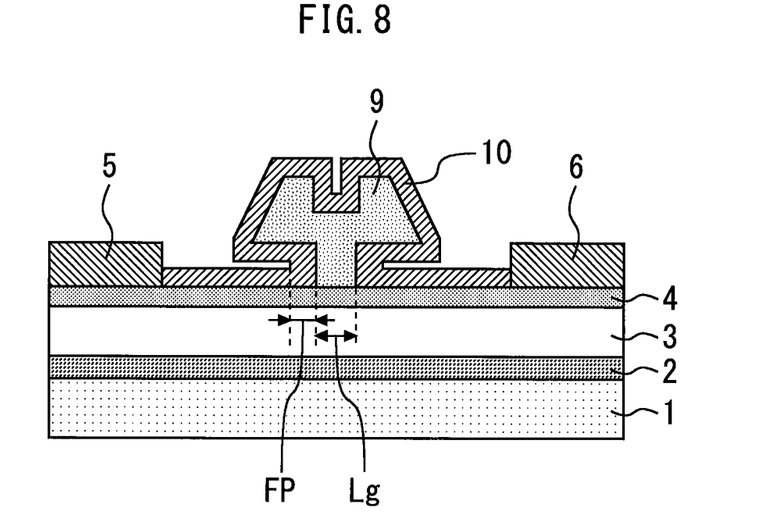
FIG. 8 is a cross-sectional view illustrating a method for manufacturing a semiconductor device according to Embodiment 2 of the present invention.
Figure 9:
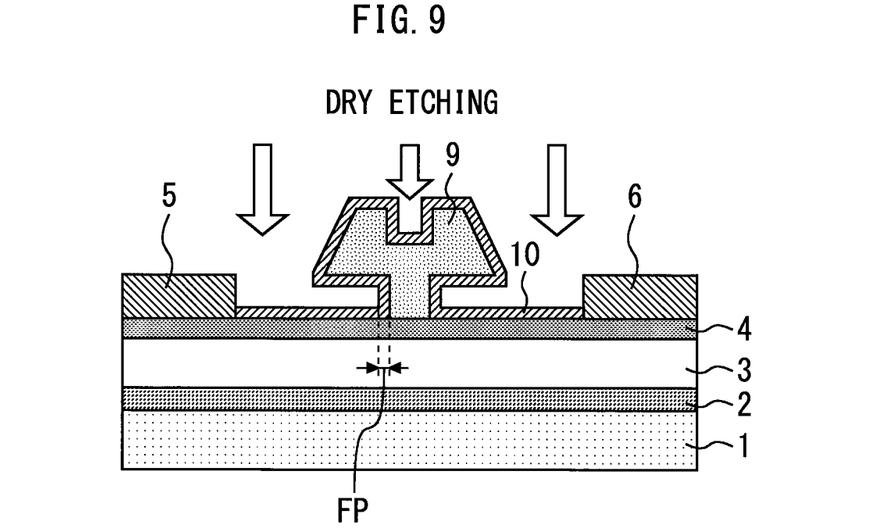
FIG. 9 is a cross-sectional view illustrating a method for manufacturing a semiconductor device according to Embodiment 2 of the present invention.

FIGS. 8 and 9 are cross-sectional views illustrating a method for manufacturing a semiconductor device according to Embodiment 2 of the present invention. As illustrated in FIG. 8, after the insulating film 10 is formed, a property of the transistor is evaluated. Next, when the evaluation result deviates from a target property, the insulating film 10 is etched. In this stage, an etching amount of the insulating film 10 is adjusted in accordance with the evaluation result, and thereby, the dimension FP is adjusted to make the property of the transistor close to the target property. Thereby, the similar effect to that of Embodiment 1 can be obtained.

The insulating film 10 preferably has a stacked structure of different layers, such as AlO/SiO or AlO/SiN. Thereby, the etching can be stopped at a specific film type since selection ratios of the individual layers are high with respect to dry etching, and hence, it can lead to better adjustment into a target film thickness. Moreover, each layer can be set to a thin film on the order of nanometers, for example, of 1 to 2 nm, which enables fine adjustment of a film thickness to be etched, and hence, controllability of the film thickness can be further improved.

Embodiment 3

In the present embodiment, a property of the transistor is evaluated before the insulating film 10 is formed. The gate length Lg of the T-shaped gate electrode 9 is measured as well as the property of the transistor. Thereby, it can also be determined whether the gate length Lg is larger or smaller than planned one. The evaluation result of the property of the transistor is added to that, and thereby, the property of the transistor can be more accurately predicted. The film type, the film thickness or the dielectric constant of the insulating film 10 is adjusted in accordance with the results, and thereby, the property of the transistor such as the dimension FP, the pulse IV property or the capacity value is made close to its target property. Thereby, property deviation among individual wafers can be suppressed even when the insulating film 11 as in Embodiment 1 is not formed.

Embodiment 4

When properties of the transistor are evaluated after the insulating film 10 is formed, in the case where the capacity value by way of example is lower than planned one but the pulse IV property is as planned, target properties cannot be obtained even if the film thickness of the insulating film 11 is adjusted. For example, when the film thickness is made large, the pulse N property results in large deviation from the target value due to a too long dimension FP although the capacity value becomes high to come close to the target value. Therefore, in the present embodiment, the dielectric constant of the insulating film 11 is adjusted in accordance with the evaluation result, and thereby, the properties of the transistor are made close to the target properties. The other configurations are similar to those in Embodiment 1.

Thereby, only the capacity value can be changed without change in film thicknesses of the insulating films 10 and 11. In the case of the aforementioned example, by employing the insulating film 11 that is high in dielectric constant with its composition ratio adjusted, only the capacity value can be made high without a large increase in film thickness, affording the transistor property as planned. For example, when the insulating films 10 and 11 are SiN, the Si composition of the insulating film 11 is made high, which leads to a high dielectric constant thereof, and hence, a SiN film thin but high in dielectric constant can be formed.

Embodiment 5

Figure 10:
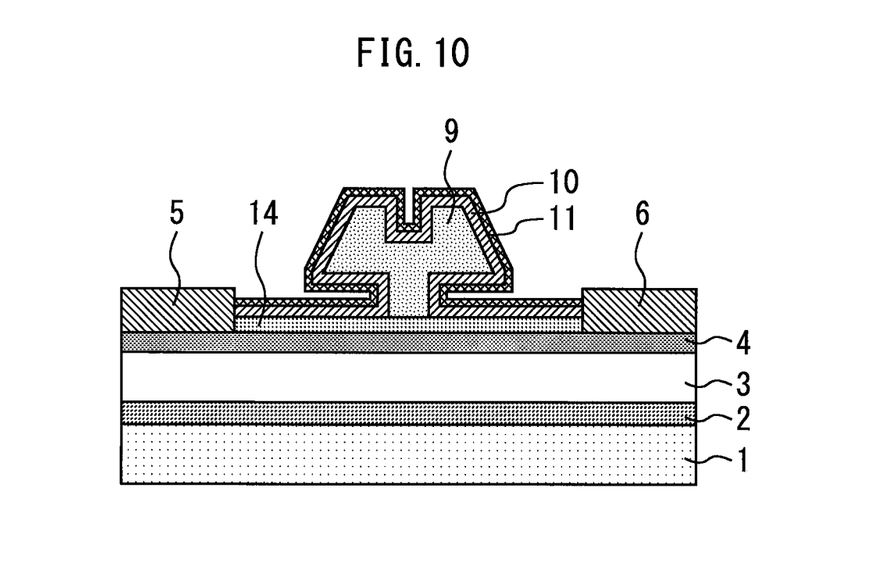
FIG. 10 is a cross-sectional view illustrating a method for manufacturing a semiconductor device according to Embodiment 5 of the present invention.

FIG. 10 is a cross-sectional view illustrating a method for manufacturing a semiconductor device according to Embodiment 5 of the present invention. On the AlGaN barrier layer 4, an insulating film 14 is formed, and on it, the T-shaped gate electrode 9 is formed. The other configurations are similar to those in Embodiment 1. The similar effect to that in Embodiment 1 can be obtained also when a MIS gate structure is formed as above.

Embodiment 6

Figure 11:
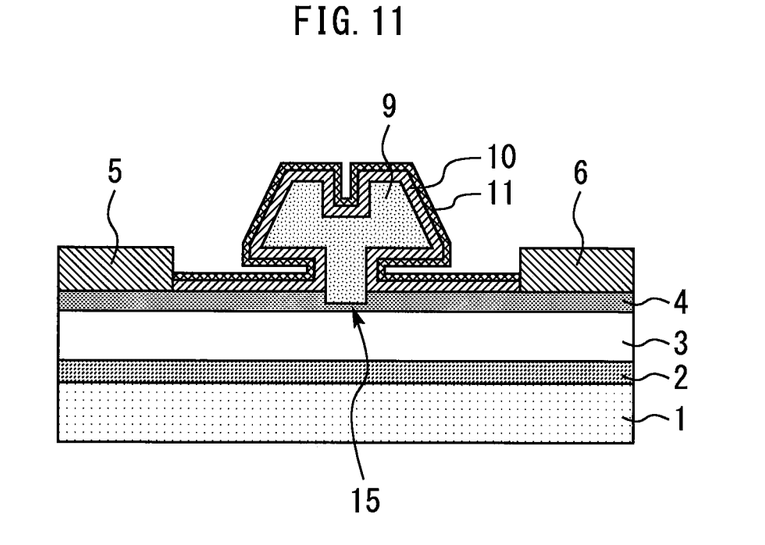
FIG. 11 is a cross-sectional view illustrating a method for manufacturing a semiconductor device according to Embodiment 6 of the present invention.

FIG. 11 is a cross-sectional view illustrating a method for manufacturing a semiconductor device according to Embodiment 6 of the present invention. A recess 15 is formed in the AlGaN barrier layer 4, and the T-shaped gate electrode 9 is formed at the recess 15. The other configurations are similar to those in Embodiment 1. The similar effect to that in Embodiment 1 can be obtained also when a recess gate structure is formed as above.

Embodiment 7

Figure 12:
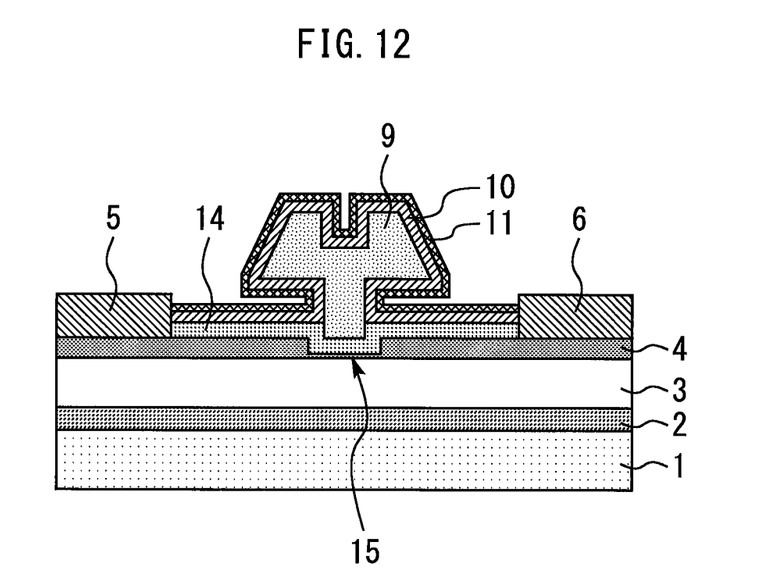
FIG. 12 is a cross-sectional view illustrating a method for manufacturing a semiconductor device according to Embodiment 7 of the present invention.

FIG. 12 is a cross-sectional view illustrating a method for manufacturing a semiconductor device according to Embodiment 7 of the present invention. After the recess 15 is formed in the AlGaN barrier layer 4 and the insulating film 14 is formed, the T-shaped gate electrode 9 is formed. The other configurations are similar to those in Embodiment 1. The similar effect to that in Embodiment 1 can be obtained also when a recess MIS gate structure is formed as above.

Embodiment 8

Figure 13:
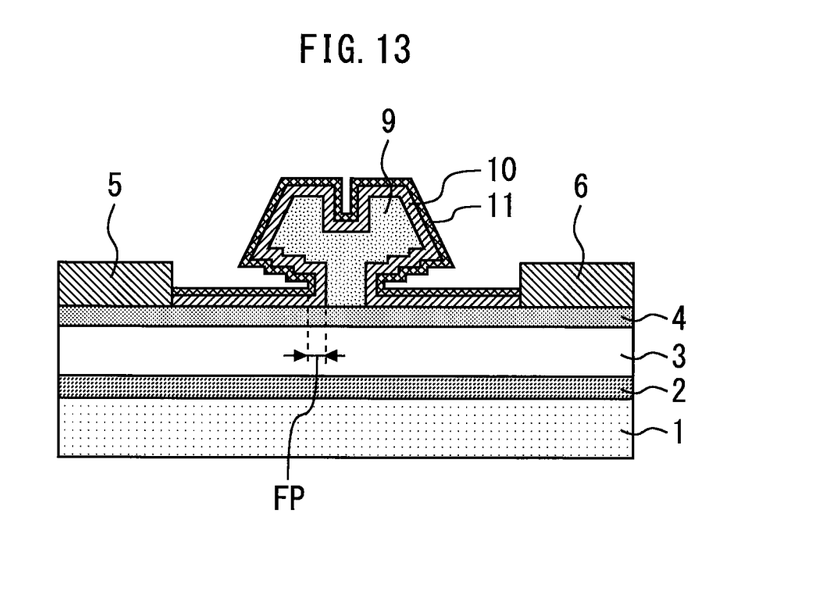
FIG. 13 is a cross-sectional view illustrating a method for manufacturing a semiconductor device according to Embodiment 8 of the present invention.

FIG. 13 is a cross-sectional view illustrating a method for manufacturing a semiconductor device according to Embodiment 8 of the present invention. The lower surface of the gate head of the T-shaped gate electrode 9 is step-like. A target transistor property can be obtained also for a gate structure in which a field plate is formed into multiple stages.

Notably, in place of the AlGaN barrier layer 4, an InAlN layer, an InGaN layer or an AlN layer may be used, and n-type doping or p-type doping may be performed thereon. Moreover, in place of the GaN channel layer 3, a GaN/AlGaN layer, a GaN/InGaN layer or an AlGaN layer lower in Al composition than a Schottky layer may be used, and each of these layers may undergo Fe doping or C doping. Moreover, not limited to GaN-based transistors, the similar effect can be obtained also when each of the manufacturing methods of Embodiments 1 to 8 is applied to GaAs-based transistors having an AlGaAs/GaAs structure and the like, the structure operating at low voltage with small influence of the dimension FP.

REFERENCE SIGNS LIST

3 GaN channel layer (GaN-based semiconductor layer); 4 AlGaN barrier layer (GaN-based semiconductor layer); 5 source electrode; 6 drain electrode; 9 T-shaped gate electrode; 10,11,14 insulating film; 15 recess

The invention claimed is:

1. A method for manufacturing a semiconductor device comprising:
forming a source electrode, a drain electrode and a T-shaped gate electrode on a GaN-based semiconductor layer to form a transistor;
forming an insulating film covering the T-shaped gate electrode;
after forming the insulating film, evaluating a property of the transistor to obtain an evaluation result of the property of the transistor, the evaluation result of the property being different from a target property of the transistor; and
adjusting a film type, a film thickness or a dielectric constant of the insulating film in accordance with the evaluation result to make the property of the transistor close to the target property, wherein
in evaluating the property of the transistor, a small signal gain, a transconductance, a gate-source capacity, a gate-drain capacity, a drain-source capacity, or a source inductance is evaluated.

2. The method for manufacturing a semiconductor device according to claim 1, wherein
the insulating film is provided on an upper surface of the T-shaped gate electrode, a lower surface of the T-shaped gate electrode, at least one lateral surface of a base portion of the T-shaped gate electrode, and an upper surface of the GaN-based semiconductor layer,
a gap is provided between the insulating film on the lower surface of a gate head of the T-shaped gate electrode and the insulating film on the upper surface of the GaN-based semiconductor layer, and
by adjusting a film thickness of the insulating film on at least one lateral surface of a base portion of the T-shaped gate electrode in accordance with the evaluation result, a dimension of a field plate formed between the gate head of the T-shaped gate electrode and the GaN-based semiconductor layer is adjusted to make the property of the transistor close to the target property.

3. The method for manufacturing a semiconductor device according to claim 2, wherein
the insulating film includes first and second insulating films,
after forming the first insulating film, the property of the transistor is evaluated,
the second insulating film is formed on the first insulating film, and
a film thickness of the second insulating film is adjusted in accordance with the evaluation result to make the property of the transistor close to the target property.

4. The method for manufacturing a semiconductor device according to claim 2, wherein
the adjusting of the film thickness includes etching the insulating film, and
an etching amount of the insulating film is adjusted in accordance with the evaluation result to make the property of the transistor close to the target property.

5. The method for manufacturing a semiconductor device according to claim 1, wherein
the insulating film includes first and second insulating films,
the evaluation of the transistor is performed after forming the first insulating film,
the second insulating film is formed on the first insulating film, and
a dielectric constant of the second insulating film is adjusted in accordance with the evaluation result to make the property of the transistor close to the target property.

6. The method for manufacturing a semiconductor device according to claim 1, further comprising
forming a third insulating film on the GaN-based semiconductor layer, wherein
the T-shaped gate electrode is formed on the third insulating film.

7. The method for manufacturing a semiconductor device according to claim 1, further comprising
forming a recess in the GaN-based semiconductor layer, wherein
the T-shaped gate electrode is formed at the recess.

8. The method for manufacturing a semiconductor device according to claim 1, wherein a lower surface of a gate head of the T-shaped gate electrode is step-like.

9. The method for manufacturing a semiconductor device according to claim 1, wherein
widths of a gate head of the T-shaped gate electrode are asymmetric on the source electrode side and the drain electrode side.

10. The method for manufacturing a semiconductor device according to claim 1, wherein
the insulating film is formed by an ALD method, a p-CVD method or a thermal CVD method.

11. The method for manufacturing a semiconductor device according to claim 1, wherein
the insulating film is a single layer or a stacked structure of layers composed by any of AlO, TaO, ZnO, SiO, MgO, GaO, TiO, HfO, ZrO, SiN and AN.

12. A method for manufacturing a semiconductor device comprising:
forming a source electrode, a drain electrode and a T-shaped gate electrode on a GaN-based semiconductor layer to form a transistor;
forming an insulating film covering the T-shaped gate electrode;
after forming the insulating film, evaluating a property of the transistor to obtain an evaluation result of the property of the transistor, the evaluation result of the property being different from a target property of the transistor; and
adjusting a film type, a film thickness or a dielectric constant of the insulating film in accordance with the evaluation result to make the property of the transistor close to the target property, wherein
in evaluating the property of the transistor, a pinch-off property, a gate-source withstand voltage, a gate-drain withstand voltage, or a pulse IV property is evaluated.

* * * * *